(12) United States Patent
Wagner et al.

(10) Patent No.: US 11,226,173 B2
(45) Date of Patent: Jan. 18, 2022

(54) LOW POWER INDICATOR CIRCUIT FOR OPTICAL SCOPES AND OTHER DEVICES

(71) Applicant: Raytheon Canada Ltd., Ottawa (CA)

(72) Inventors: Kevin B. Wagner, Wyevale (CA); Ryan W. Nobes, New Lowell (CA)

(73) Assignee: Raytheon Canada Ltd., Ottawa (CA)

( * ) Notice: Subject to any disclaimer, the term of this patent is extended or adjusted under 35 U.S.C. 154(b) by 10 days.

(21) Appl. No.: 16/704,382

(22) Filed: Dec. 5, 2019

(65) Prior Publication Data

US 2020/0109915 A1 Apr. 9, 2020

Related U.S. Application Data

(63) Continuation of application No. PCT/CA2017/051134, filed on Sep. 26, 2017.

(51) Int. Cl.
*F21V 23/04* (2006.01)
*F41G 1/38* (2006.01)
(Continued)

(52) U.S. Cl.
CPC .......... *F41G 1/345* (2013.01); *F21V 23/0407* (2013.01); *F21V 23/0442* (2013.01);
(Continued)

(58) Field of Classification Search
CPC . B60R 26/10; B60R 25/1004; B60R 25/1018; G01R 21/06; G01R 21/07;
(Continued)

(56) References Cited

U.S. PATENT DOCUMENTS 5,035,472 A * 7/1991 Hansen .................. F41G 1/345
359/350
6,625,553 B1 * 9/2003 Modgil .................. B60R 25/04
307/10.7
(Continued)

FOREIGN PATENT DOCUMENTS

CA 2686228 A1 12/2008
CA 2651697 A1 8/2009
(Continued)

OTHER PUBLICATIONS

Eotech. <https://www.ar15.com/forums/ar-15/Eotech_XPS2_Flashing_Reticle_Question/18-513155/>. Oct. 9, 2010. (Year: 2010).*
(Continued)

*Primary Examiner* — Gabriel J. Klein

(57) ABSTRACT

An apparatus includes one or more light emitting diodes (LEDs) configured to be coupled to a power supply and to generate illumination, such as to generate a reticle in an optical scope. The apparatus also includes a first switch coupled in series with the one or more LEDs. The first switch is configured to selectively activate and deactivate the one or more LEDs based on whether the first switch is turned on or off. The apparatus further includes a low power detector configured to sense a low power condition of the power supply and to repeatedly turn the first switch on and off in response to the low power condition to cause the one or more LEDs to blink. The low power detector is configured to turn the first switch on and off at a given rate, and the given rate increases as the power supply is depleted.

20 Claims, 4 Drawing Sheets

(51) Int. Cl.
  *G02B 27/34* (2006.01)
  *H02J 7/00* (2006.01)
  *F41G 1/34* (2006.01)
  *H02J 7/34* (2006.01)

(52) U.S. Cl.
  CPC ............... *F41G 1/38* (2013.01); *G02B 27/34* (2013.01); *H02J 7/0047* (2013.01); *H02J 7/0068* (2013.01); *H02J 7/345* (2013.01)

(58) Field of Classification Search
  CPC ... H02H 7/16; H02H 7/18; H02H 7/20; F41G 1/38; F41G 1/34; F41G 1/12; F21V 23/0407; F21V 23/0442; G02B 27/34
  See application file for complete search history.

(56) References Cited

U.S. PATENT DOCUMENTS

| | | | |
|---|---|---|---|
| D506,520 S | 6/2005 | Timm et al. | |
| 7,650,711 B2 | 1/2010 | Robitaille | |
| 2007/0205908 A1 | 9/2007 | Du et al. | |
| 2009/0120373 A1* | 5/2009 | Wetzel | A01K 15/021 |
| | | | 119/719 |
| 2012/0176064 A1* | 7/2012 | Saes | H05B 45/37 |
| | | | 315/297 |
| 2012/0186132 A1 | 7/2012 | Matthews et al. | |
| 2015/0323286 A1 | 11/2015 | Theriault | |
| 2016/0231083 A1* | 8/2016 | Regan | F41G 3/06 |
| 2017/0082400 A1 | 3/2017 | York et al. | |
| 2019/0141983 A1* | 5/2019 | Morton | F21S 10/06 |
| | | | 250/494.1 |

FOREIGN PATENT DOCUMENTS

| | | | | |
|---|---|---|---|---|
| EP | 2375540 A2 | 10/2011 | | |
| KR | 10-2013-0091677 A | 8/2013 | | |
| WO | 2012/058453 A2 | 5/2012 | | |
| WO | WO-2019020085 A1 * | 1/2019 | | G01R 21/06 |

OTHER PUBLICATIONS

International Search Report and Written Opinion of the International Searching Authority in connection with International Patent Application No. PCT/CA2017/051134 dated Jul. 9, 2018, 11 pages.

Linear Technology Corp., "Ultra-Low Power Adjustable Supervisor with Power-Fail Output," Datasheet for Part No. LTC2934, 2008, 12 pages.

Supplementary European Search Report dated Mar. 24, 2021 in connection with European Patent Application No. 17926787.7, 8 pages.

* cited by examiner

LOW POWER INDICATOR CIRCUIT FOR OPTICAL SCOPES AND OTHER DEVICES

CROSS-REFERENCE TO RELATED APPLICATION AND PRIORITY CLAIM

This application claims priority as a continuation of International Patent Application No. PCT/CA2017/051134 filed on Sep. 26, 2017. This application is hereby incorporated by reference in its entirety.

TECHNICAL FIELD

This disclosure generally relates to optical devices and other devices having internal power supplies. More specifically, this disclosure relates to a low power indicator circuit for optical scopes and other devices.

BACKGROUND

Rifles and other weapons used by military, police, hunters, or other personnel routinely include optical scopes that include reticles. A reticle refers to a crosshair, grid, or other pattern in an optical scope or other optical device. A user can use the reticle of an optical scope to establish scale or position, such as when aiming a rifle or other weapon. Optical scopes often include passive illumination systems for generating the reticles. Many of these passive illumination systems simply include a battery, a resistor, and an illumination light emitting diode (LED) connected in series. Current flows through the resistor and the LED, and the LED generates light in a desired pattern to form a reticle.

SUMMARY

This disclosure provides a low power indicator circuit for optical scopes and other devices.

In a first embodiment, an apparatus includes one or more light emitting diodes (LEDs) configured to be coupled to a power supply and to generate illumination. The apparatus also includes a first switch coupled in series with the one or more LEDs. The first switch is configured to selectively activate and deactivate the one or more LEDs based on whether the first switch is turned on or off. In addition, the apparatus includes a low power detector configured to sense a low power condition of the power supply. The low power detector is also configured to repeatedly turn the first switch on and off in response to the low power condition to cause the one or more LEDs to blink. The low power detector is configured to turn the first switch on and off at a given rate, and the given rate increases as the power supply is depleted.

In a second embodiment, a system includes an optical scope having an eyepiece. The system also includes one or more LEDs configured to be coupled to a power supply and to generate illumination that forms a reticle viewable through the eyepiece of the optical scope. The system further includes a low power indicator circuit having a first switch and a low power detector. The first switch is coupled in series with the one or more LEDs. The first switch is configured to selectively activate and deactivate the one or more LEDs based on whether the first switch is turned on or off. The low power detector is configured to sense a low power condition of the power supply. The low power detector is also configured to repeatedly turn the first switch on and off in response to the low power condition to cause the one or more LEDs and the reticle to blink. The low power detector is configured to turn the first switch on and off at a given rate, and the given rate increases as the power supply is depleted.

In a third embodiment, a method includes generating illumination using one or more LEDs coupled to a power supply. The method also includes detecting a low power condition of the power supply. The method further includes, in response to detecting the low power condition, repeatedly activating and deactivating the one or more LEDs using a first switch coupled in series with the one or more LEDs to cause the one or more LEDs to blink. The repeated activating and deactivating is based on turning the first switch on and off. The first switch is turned on and off at a given rate, and the given rate increases as the power supply is depleted.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 5, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
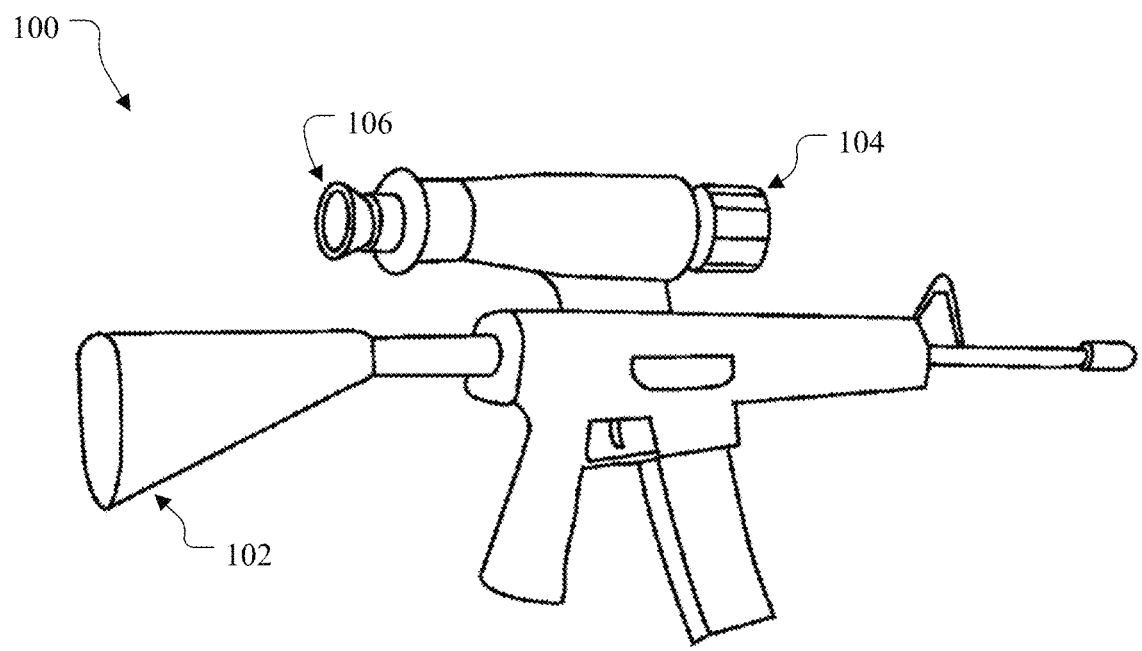
FIG. 1 illustrates an example system having an optical device with a low power indicator circuit according to this disclosure.

FIG. 1 illustrates an example system 100 having an optical device with a low power indicator circuit according to this disclosure. As shown in FIG. 1, the system 100 includes a weapon 102 having an optical scope 104. The weapon 102 represents a rifle or other firearm or other weapon that can be aimed and fired by a user. Any suitable weapon 102 having an optical scope 104 could be used here. Example types of weapons 102 that could be used with the optical scope 104 include infantry automatic rifles, sniper rifles, hunting rifles, or other weapons used by military, police, hunters, or other personnel.

The optical scope 104 is used by a user to aim or target the weapon 102. For example, a user could look through an eyepiece 106 of the optical scope 104, and a reticle can be displayed to the user. The reticle includes a crosshair, grid, or other optical pattern that is displayed in order to help the user aim the weapon 102. Various other features could also be incorporated into the optical scope 104. For instance, the optical scope 104 could include one or more telescopic lenses that allow the user to view objects that are farther away. The optical scope 104 could include components that support flash suppression or night-vision operation. In general, any suitable optical scope 104 that includes a reticle or other visual indicator could be used here. As a particular example, the optical scope 104 could represent a reflex or collimator sight that uses a red dot as a reticle.

As noted above, rifles and other weapons routinely include optical scopes that include reticles. Passive illumination systems are often used for generating the reticles, and these passive illumination systems may include a battery, a resistor, and an illumination light emitting diode (LED) coupled in series. Many conventional optical scopes lack mechanisms for indicating to users that the batteries of the optical scopes are suffering from a low power condition. Instead, the passive illumination system of a conventional optical scope would simply stop functioning once its battery was discharged. This is clearly undesirable since it provides no warning and no opportunity to replace or recharge the batteries.

Various devices like smartphones and laptop computers use conventional "low power" detectors to indicate when the power stored on their internal power supplies is low. Even though these conventional low power detectors consume power during operation, the amount of power consumed by the low power detectors is small relative to the total power that can be stored by these devices' internal power supplies. As a result, the power used by the conventional low power detectors was typically viewed as an acceptable power loss. However, these conventional low power detectors have not been used in optical scopes or other devices having small internal power supplies because the amount of power consumed by the low power detectors was much higher relative to the total power that could be stored by the devices' internal power supplies. In optical scopes, for example, the conventional low power detectors could actually consume more power than a passive illumination system, which meant that including a conventional low power detector in an optical scope would significantly shorten the length of time that a battery could be used.

In accordance with this disclosure, the optical scope 104 of FIG. 1 (or any other suitable device) includes a low power indicator circuit. The low power indicator circuit consumes a much smaller amount of power compared to conventional low power detectors. As a result, the low power indicator circuit can be used in devices like the optical scope 104 that lack large internal power supplies. Of course, the low power indicator circuit could also be used in devices having large internal power supplies since the low power indicator circuit still provides significantly reduced power consumption.

The low power indicator circuit can also be used to create blinking of a reticle in the optical scope 104 or the blinking of another indicator in a device. Moreover, the blink rate could vary based on the amount of power remaining in a power supply. Thus, the low power indicator circuit can provide an indication of how much power remains stored in a power supply while still allowing the optical scope 104 or other device to be used by a user. For instance, the low power indicator circuit could cause the reticle in the optical scope 104 to blink, but a user could still use the optical scope 104 for targeting purposes. The blinking rate of the reticle in the optical scope 104 could also inform the user of the remaining charge level of the power supply. It is therefore far less likely that a user of the weapon 102 would suddenly find himself or herself without a reticle being displayed by the optical scope 104.

Additional details regarding the low power indicator circuit are provided below. Note that while often described as being used in an optical scope 104 for a weapon 102, the low power indicator circuit could be used with any other suitable devices. For example, the low power indicator circuit could be used in laptop computers, tablet computers, smartphones, smart watches, smart glasses, or other devices having internal power supplies.

Although FIG. 1 illustrates one example of a system 100 having an optical device with a low power indicator circuit, various changes may be made to FIG. 1. For example, the optical scope 104 need not be used with a rifle and could be used with any other suitable types of devices. Other example types of devices that could include a low power indicator circuit are fire control systems, theodolites, and surveyor transits.

Figure 2:
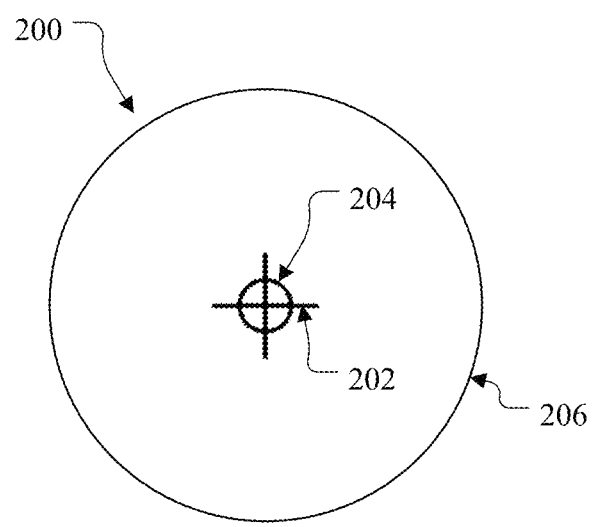
FIG. 2 illustrates an example reticle used in an optical device with a low power indicator circuit according to this disclosure.

FIG. 2 illustrates an example reticle 200 used in an optical device with a low power indicator circuit according to this disclosure. For ease of explanation, the reticle 200 shown in FIG. 2 is described as being generated by the optical scope 104 used with the weapon 102 of FIG. 1. However, the reticle 200 could be generated by any other suitable optical device, and the optical device may or may not be used in conjunction with a weapon.

As shown in FIG. 2, the reticle 200 includes multiple lines 202 forming a crosshair. In this example, there are two lines 202, one horizontal and one vertical, forming the crosshair. However, other numbers of lines 202 could be used to form a crosshair in the reticle 200, and other arrangements of lines 202 could be used to form a crosshair in the reticle 200. For instance, the two lines 202 in FIG. 2 could be rotated (such as by 45°) to form a crosshair, or more than two lines 202 (spaced evenly or unevenly) could be used to form a crosshair. The reticle 200 in this example also includes a circle 204, which is centered at the point where the lines 202 cross. The circle 204 could be used for various purposes, such as to show potential targeting with a spread pattern or to identify potential impact points.

The lines 202 and the circle 204 could be created in the reticle 200 using one or more LEDs or other light sources. The LEDs could be powered by an internal battery or other internal power supply of the optical scope 104. As described in more detail below, a low power indicator circuit of the optical scope 104 could be used to sense when the power stored by the internal battery or other internal power supply of the optical scope 104 becomes low. The low power indicator circuit of the optical scope 104 could then cause the reticle 200 to blink on and off, thereby informing the user of the low power condition. Moreover, the blink rate could vary depending on the remaining power stored by the optical scope's internal power supply, thereby informing the user of the criticality of the low power condition.

An outer boundary 206 of the reticle 200 in FIG. 2 could represent an illuminated circle or other shape. Alternatively, the outer boundary 206 of the reticle 200 could represent a physical boundary, such as the inner surface of the eyepiece 106 or the inner surface of the optical scope 104. As such, this portion of the reticle 200 in FIG. 2 may or may not blink when the power stored by the optical scope's internal power supply becomes too low.

Although FIG. 2 illustrates one example of a reticle 200 used in an optical device with a low power indicator circuit, various changes may be made to FIG. 2. For example, the reticle 200 shown in FIG. 2 is merely one example of a reticle that could be used in an optical device having a low power indicator circuit. Numerous reticle patterns of varying complexities have been developed over the years, and any suitable reticle could be used with a low power indicator circuit, such as a single dot in a reflex, collimator, or other sight. Also, as noted above, the low power indicator circuit need not be used with optical scopes and could cause other indicators to blink.

Figure 3:
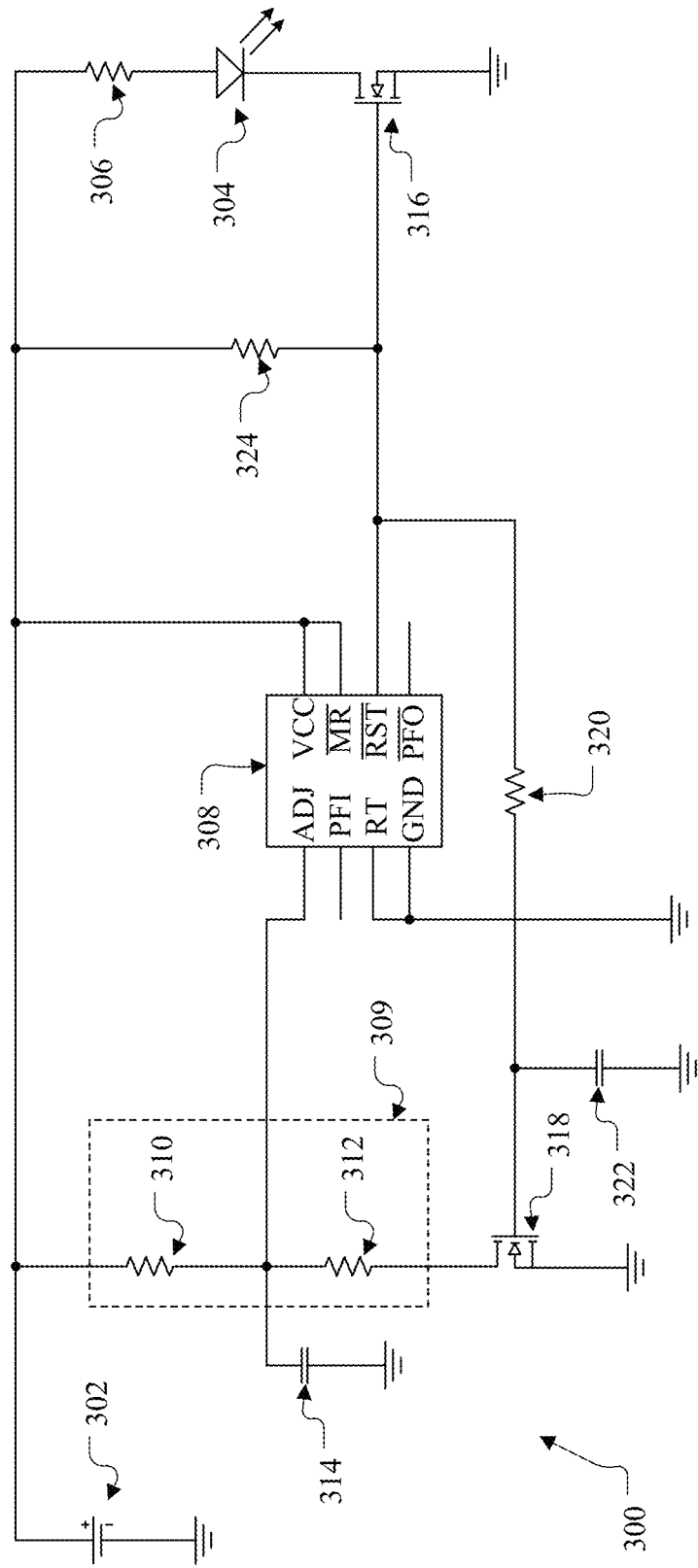
FIG. 3 illustrates an example low power indicator circuit for optical scopes and other devices according to this disclosure.

FIG. 3 illustrates an example low power indicator circuit 300 for optical scopes and other devices according to this disclosure. For ease of explanation, the low power indicator circuit 300 shown in FIG. 3 is described as being used in the optical scope 104 with the weapon 102 of FIG. 1. However, the low power indicator circuit 300 could be used with any other suitable optical device or other device, and the device may or may not be used in conjunction with a weapon.

As shown in FIG. 3, the low power indicator circuit 300 includes or is used in conjunction with at least one power supply 302 and at least one LED 304. The power supply 302 represents any suitable source of electrical current for one or more LEDs, such as one or more batteries or super-capacitors. As a particular example, the power supply 302 could include one or more lithium-ion batteries or batteries with other chemistries.

The one or more LEDs 304 are used to generate illumination, which could be used for various purposes. For example, in an optical scope 104, the one or more LEDs 304 could generate visible illumination that is used to create a reticle within the optical scope 104, such as by generating lines, circles, or other patterns of optical illumination. As described below, other components of the low power indicator circuit 300 could cause the one or more LEDs 304 to blink, thereby causing the reticle to blink, in order to inform a user that the power stored by the power supply 302 is low. Note, however, that the illumination generated by the one or more LEDs 304 could be used for any other suitable purposes. For instance, an LED 304 could be used to generate visible illumination to inform a user that a device is powered on, and the illumination could blink to inform the user of a low power condition. Each LED 304 includes any suitable semiconductor structure for generating light.

A resistor 306 is coupled in series between the power supply 302 and the one or more LEDs 304. The resistor 306 provides a resistance to allow a desired amount of current to flow through the one or more LEDs 304. The resistor 306 includes any suitable resistive structure and provides any suitable resistance. In particular embodiments, the resistor 306 could represent a 10 kΩ resistor, although other resistances could be used.

A low power detector 308 is used to sense a low voltage, low current, or other indicator associated with the power supply 302 in order to detect a low power condition. The low power detector 308 could perform this function while consuming a very small amount of power during operation. In some embodiments, for example, the low power detector 308 could consume power in the nano-watt range, while the one or more LEDs 304 could generate illumination using about 0.5 to about 1.0 micro-watts of power (although LEDs and low power detectors with other power consumptions could also be used). As a result, unlike conventional low power detectors, the low power detector 308 in FIG. 3 does not consume more power than the LEDs 304, enabling use of the low power indicator circuit 300 in optical scopes 104 or other devices having small internal power storage. The low power detector 308 includes any suitable structure for identifying low voltage, low current, or other indicator(s) of low power from a power supply. In particular embodiments, the low power detector 308 represents an LTC2934 ultra-low power voltage monitor from LINEAR TECHNOLOGY CORP.

A voltage divider 309 is formed in the low power indicator circuit 300 using a first resistor 310 and a second resistor 312, and a first capacitor 314 is coupled to the node between the resistors 310 and 312 and to ground. A voltage from the power supply 302 is divided by the resistors 310 and 312, and the capacitor 314 can be charged to the voltage present at the node between the resistors 310 and 312. This voltage is provided as an input to the low power detector 308. Each of the resistors 310 and 312 includes any suitable resistive structure and provides any suitable resistance. In particular embodiments, the resistor 310 could represent a 2.4 MΩ resistor and the resistor 312 could represent a 536kΩ resistor, although other resistances could be used. The ratio of these resistors 310 and 312 sets the voltage that is presented to the input of the low power detector 308.

The capacitor 314 operates to store an electrical charge during certain time periods and to release the electrical charge during other time periods. As described in more detail below, when the power stored in the power supply 302 is high, the capacitor 314 can remain charged. When the power stored in the power supply 302 drops below a certain level, the capacitor 314 can alternately be charged and discharged to cause the one or more LEDs 304 to blink. The capacitor 314 includes any suitable capacitive structure and provides any suitable capacitance. In particular embodiments, the capacitor 314 could represent a 10 μF capacitor, although other capacitances could be used.

A first switch 316 is used in the low power indicator circuit 300 to control the flow of current through the one or more LEDs 304. When the switch 316 is closed or turned on, current can flow from the power supply 302 through the one or more LEDs 304 to ground, causing the one or more LEDs 304 to turn on and generate illumination. When the switch 316 is opened or turned off, current cannot flow from the power supply 302 through the one or more LEDs 304, causing the one or more LEDs 304 to turn off and not generate illumination.

A second switch 318 is also used in the low power indicator circuit 300 to control the flow of current through the voltage divider 309. When the switch 318 is opened or turned off, current can flow from the power supply 302 through the resistor 310 and the capacitor 314 to ground, charging the capacitor 314. When the switch 316 is closed or turned on, current can flow from the power supply 302 through the resistors 310 and 312 to ground, discharging the capacitor 314.

Each of the switches 316 and 318 includes any suitable structure configured to selectively form and break an electrical connection, such as a transistor. In particular embodiments, each of the switches 316 and 318 represents an n-type metal oxide semiconductor field effect transistor (MOSFET), although other types of transistors could also be used.

In this example, the low power detector 308 includes a number of input and output pins, which relate to a specific implementation of the low power detector 308 (one using the LTC2934 ultra-low power voltage monitor). Of course, low power detectors 308 implemented in other ways could use different sets of input and output pins. As can be seen in FIG. 3, an ADJ input pin is coupled between the resistors 310 and 312 forming the voltage divider 309. A PFI input pin and a $\overline{PFO}$ output pin are unused and could be coupled to a voltage rail (which is coupled to the upper terminal of the power supply 302) or to ground. RT and GND pins are coupled to ground, and VCC and $\overline{MR}$ pins are coupled to the voltage rail. A $\overline{RST}$ pin provides an output signal that is used by other components of the low power indicator circuit 300.

The low power detector 308 is coupled to a gate of the switch 316, thereby controlling whether the switch 316 is conductive and the one or more LEDs 304 are turned on or off. The low power detector 308 is also coupled to a gate of the switch 318 via a third resistor 320, which is also coupled to a second capacitor 322. In addition, a fourth resistor 324 is coupled to the power supply 302 and to the output of the low power detector 308, which is coupled to the gates of the switches 316 and 318.

Each resistor 320 and 324 includes any suitable resistive structure and provides any suitable resistance. In particular embodiments, the resistor 320 could represent a 178 kΩ resistor and the resistor 324 could represent a 2.4 MΩ resistor, although other resistances could be used. The capacitor 322 includes any suitable capacitive structure and provides any suitable capacitance. In particular embodiments, the capacitor 322 could represent a 47 nF capacitor, although other capacitances could be used.

In the example implementation shown in FIG. 3, the voltage provided by the power supply 302 is sensed by the low power detector 308 through the voltage divider 309 (at the node between the resistors 310 and 312). During regular (non-low power) operating conditions, that voltage is higher than a trigger voltage of the low power detector 308. As a result, the $\overline{\text{RST}}$ output of the low power detector 308 is high, allowing the resistor 324 to bias the switch 316 on and allowing the one or more LEDs 304 to generate illumination. When used in an optical scope, the one or more LEDs 304 could generate a reticle pattern for viewing by a user. Since the $\overline{\text{RST}}$ output of the low power detector 308 is high, the switch 318 is also turned on, allowing the voltage divider 309 to divide the power supply voltage for sensing by the low power detector 308. At initial turn on, the switch 318 can be off to help ensure that the circuit will not trigger blinking of the one or more LEDs 304.

As the power supply's voltage drops (such as when a battery approaches its end of life voltage), the voltage presented to the low power detector 308 by the voltage divider 309 becomes low enough to cause the low power detector 308 to activate the $\overline{\text{RST}}$ output, causing that output to go low. This pulls the signal on the gate of the switch 316 low, causing the switch 316 to immediately open and stop the generation of illumination by the one or more LEDs 304. This also causes the gate of the switch 318 to go low, but this does not occur instantly due to the discharge of the capacitor 322. When the switch 318 eventually opens, the voltage on the ADJ pin of the low power detector 308 is governed by the circuit path from the power supply 302 through the resistor 310 and through the capacitor 314. The capacitor 314 is charged by the current from the power supply 302, so the voltage sensed by the low power detector 308 increases. When the voltage stored on the capacitor 314 rises above the trigger voltage of the low power detector 308, the $\overline{\text{RST}}$ output goes high again, which turns the switches 316 and 318 back on. This turns the one or more LEDs 304 back on and causes the capacitor 314 to discharge. Repeating this process causes the one or more LEDs 304 to blink, and the discharge characteristic of the capacitor 314 varies so that the one or more LEDs 304 blink faster as the power supply voltage decreases.

In this way, the low power indicator circuit 300 can repeatedly interrupt the flow of current through the one or more LEDs 304 when the power stored in the power supply 302 drops to a low level. This causes blinking of the one or more LEDs 304, which can be noticed by a user so that the user knows to change or recharge the power supply 302. Moreover, the blinking rate of the one or more LEDs 304 increases as the power stored in the power supply 302 continues to drop, which helps to inform the user about the criticality of the low power condition. When the one or more LEDs 304 are used to generate a reticle in an optical scope 104, the blinking helps to notify a user that the power supply 302 needs to be replaced or recharged, and the blinking rate helps to notify the user how low the power stored in the power supply 302 has dropped.

Although FIG. 3 illustrates one example of a low power indicator circuit 300 for optical scopes and other devices, various changes may be made to FIG. 3. For example, the specific implementation of the low power detector 308 shown in FIG. 3 is for illustration only. Other low power detectors could be used, and the specific circuit components used with the low power detectors could vary depending on the implementation. Also, while each individual power supply, resistor, and capacitor is shown as a single component, multiple components could be used, such as when multiple power supplies, resistors, or capacitors are coupled in series or in parallel to create a desired effect. As particular examples, at least one resistor or capacitor shown in FIG. 3 could be implemented using a variable resistor/capacitor, or at least one resistor or capacitor shown in FIG. 3 could be implemented using multiple resistors/capacitors with at least one switch that allows reconfiguration of the resistors/capacitors.

Figure 4:
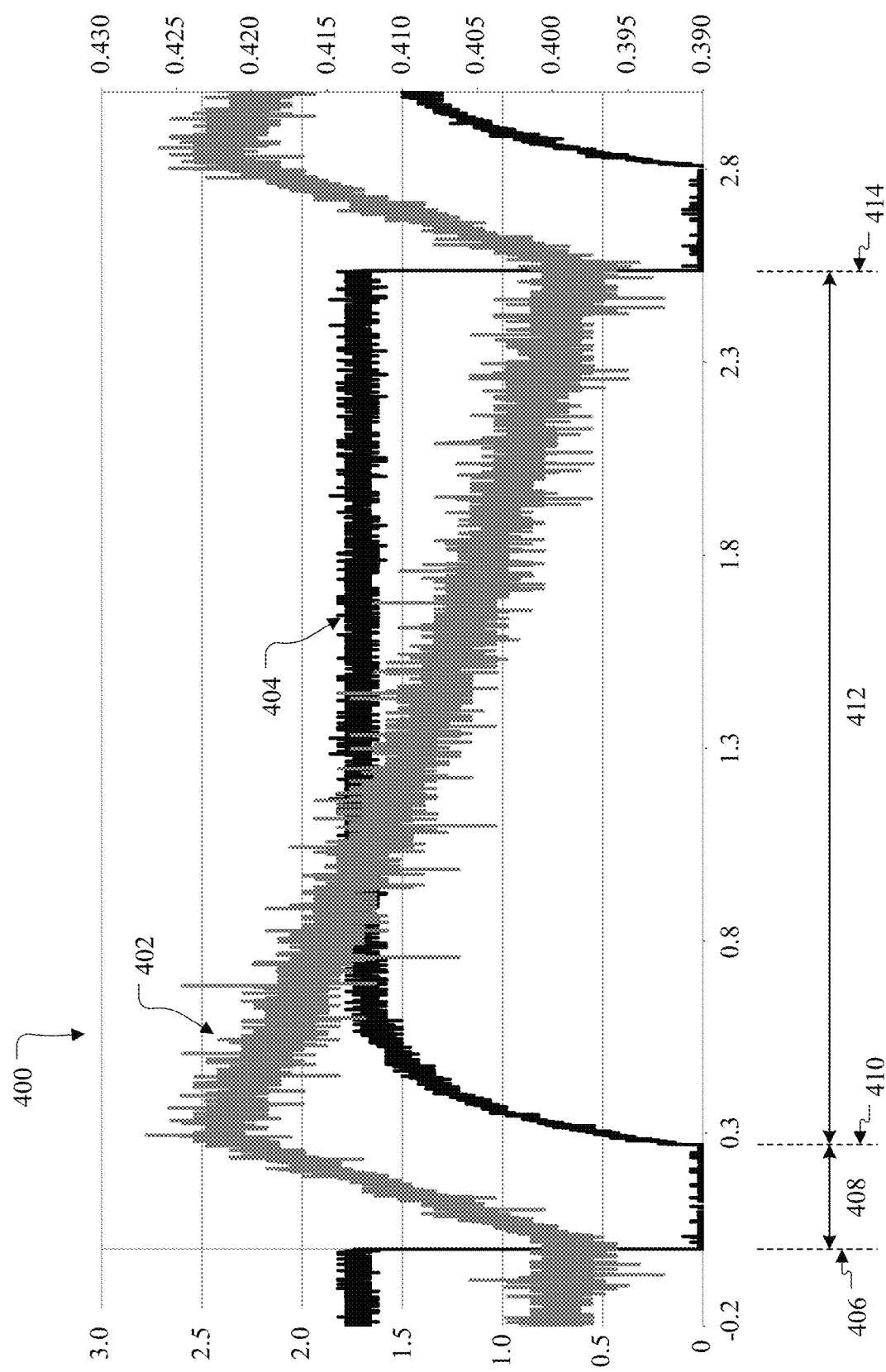
FIG. 4 illustrates an example timing diagram associated with a low power indicator circuit for optical scopes and other devices according to this disclosure.

FIG. 4 illustrates an example timing diagram 400 associated with a low power indicator circuit for optical scopes and other devices according to this disclosure. For ease of explanation, the timing diagram 400 shown in FIG. 4 is described as representing example operations of the low power indicator circuit 300 of FIG. 3. However, other embodiments of the low power indicator circuit 300 could operate in any other suitable manner.

In FIG. 4, it is assumed that the low power indicator circuit 300 is operating during a low power condition. As a result, the low power detector 308 is causing the one or more LEDs 304 to blink. As shown in FIG. 4, a line 402 represents the voltage stored on the capacitor 314, and a line 404 represents the output of the low power detector 308 (such as on the $\overline{\text{RST}}$ pin of the low power detector 308).

At time 406, the line 404 goes low, meaning the charge stored on the capacitor 314 reaches or has fallen below a lower threshold value. This opens the switches 316 and 318, so the one or more LEDs 304 are not generating illumination and the capacitor 314 is charged during a time period 408. At time 410, the charge stored on the capacitor 314 reaches or exceeds an upper threshold value, and the line 404 goes high. This closes the switches 316 and 318, so the one or more LEDs 304 are turned on and generate illumination and the capacitor 314 is discharged during a time period 412. Eventually, the charge stored on the capacitor 314 drops enough to cause the switches 316 and 318 to be opened again at time 414, and the same process can be repeated.

Note that this process can repeat any number of times as the power supply 302 continues to be depleted. As the amount of power stored in the power supply 302 drops further, the length of one or more of the time periods 408 and 412 decreases so that the one or more LEDs 304 blink faster. Assuming the power supply 302 is not replaced or recharged, this can continue until the capacitor 314 cannot be charged adequately to turn the one or more LEDs 304 back on.

Although FIG. 4 illustrates one example of a timing diagram 400 associated with a low power indicator circuit for optical scopes and other devices, various changes may be made to FIG. 4. For example, the timings of operations in the low power indicator circuit 300 could vary depending on a number of factors, such as the implementation of the low power indicator circuit 300.

Figure 5:
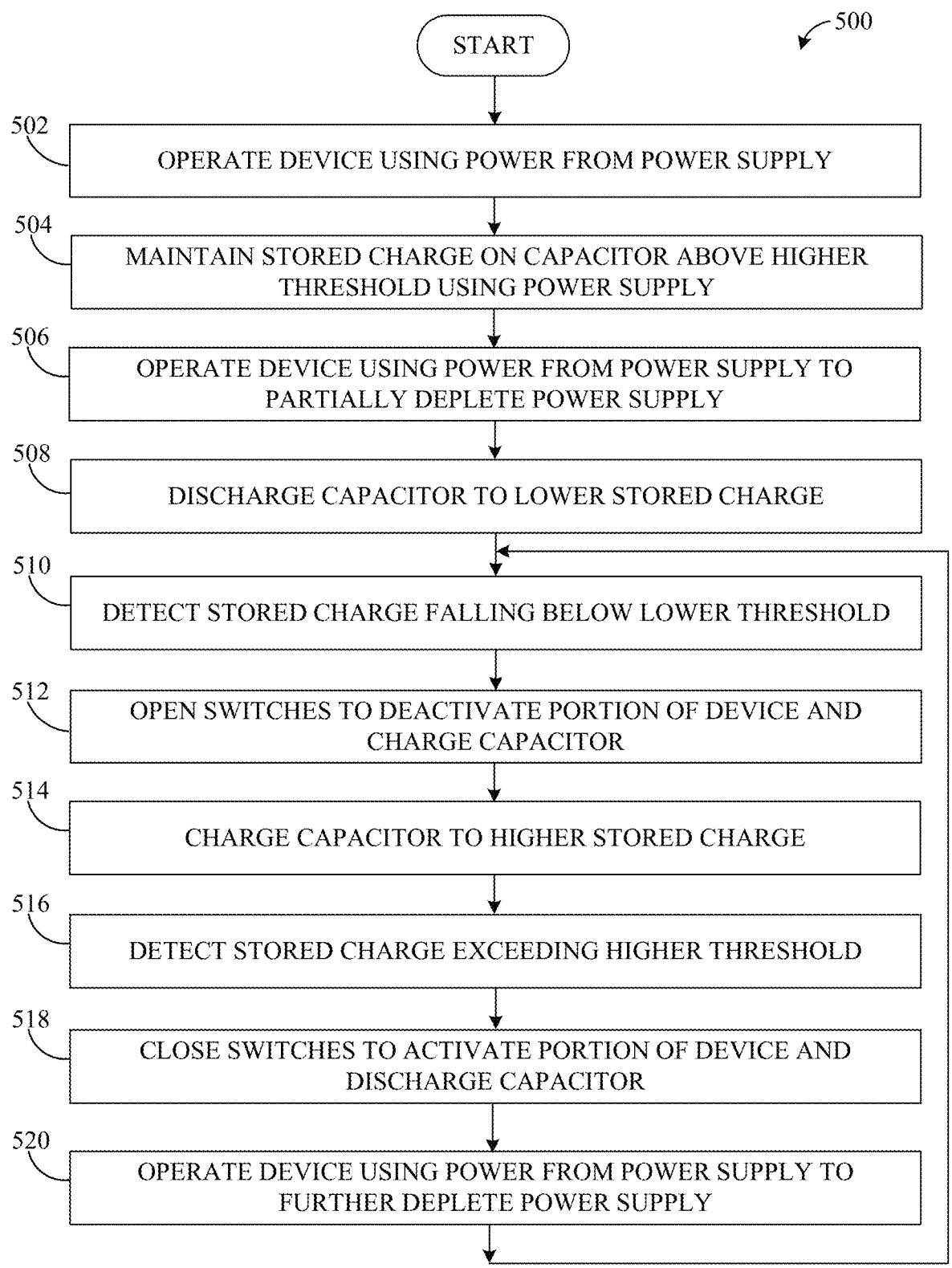
FIG. 5 illustrates an example method for providing a low power indicator for optical scopes and other devices according to this disclosure.

FIG. 5 illustrates an example method 500 for providing a low power indicator for optical scopes and other devices according to this disclosure. For ease of explanation, the method 500 shown in FIG. 5 is described as being performed using the low power indicator circuit 300 of FIG. 3 in the optical scope 104 with the weapon 102 of FIG. 1. However, the method 500 could be performed using any suitable low power indicator circuit, and the method 500 could be used with any suitable device or system.

As shown in FIG. 5, a device is operated using power from a power supply at step 502. This could include, for example, the optical scope 104 using power from a battery or other power supply 302 to power one or more LEDs 304. This could also include the one or more LEDs 304 generating illumination to create a reticle pattern that is viewable through the eyepiece 106 of the optical scope 104. During this time, a stored charge on a capacitor is maintained above a higher threshold at step 504. This could include, for example, the capacitor 314 maintaining a higher charge level so that the voltage sensed by the low power detector 308 is high, indicating that the power supply 302 is not in a low power state. The switches 316 and 318 are closed here to allow the one or more LEDs 304 to generate illumination and to allow the voltage divider 309 to maintain the charge stored on the capacitor 314. The device therefore operates using power from the power supply and partially depletes the power supply over time at step 506.

Eventually, the power stored in the power supply can drop to a point where a low power condition exists. As a result, the capacitor is discharged, lowering the stored charge at step 508. This could include, for example, the capacitor 314 discharging through the resistor 312 and the switch 318 to ground. If the stored charge falls below a lower threshold, this condition is detected at step 510. This could include, for example, the low power detector 308 detecting that the input voltage from the voltage divider 309 and the capacitor 314 is at or below a lower threshold value. In response to detecting this condition, switches of the device are opened to deactivate at least part of the device and to charge the capacitor at step 512. This could include, for example, the low power detector 308 outputting a low signal that opens the switch 316 and, shortly thereafter, opens the switch 318. The opening of the switch 316 deactivates the one or more LEDs 304 so that they no longer generate illumination. The opening of the switch 318 forces current flowing through the resistor 310 to also flow through the capacitor 314. This charges the capacitor to a higher stored charge at step 514.

At some point, the charge stored on the capacitor can exceed the higher threshold, and this condition is detected at step 516. This could include, for example, the low power detector 308 detecting that the input voltage from the voltage divider 309 and the capacitor 314 is at or above a higher threshold value. In response to detecting this condition, the switches of the device are closed to activate at least part of the device and to discharge the capacitor at step 518. This could include, for example, the low power detector 308 outputting a high signal that closes the switch 316 and, shortly thereafter, closes the switch 318. The closing of the switch 316 activates the one or more LEDs 304 so that they generate illumination. The closing of the switch 318 allows the capacitor 314 to discharge through the resistor 312 and the switch 318. The device then operates using power from the power supply, further depleting the power supply at step 520.

The method 500 then returns to step 510, where the process of turning at least the portion of the device off and back on again is repeated. Because the capacitor 314 discharges to the lower threshold level faster as the voltage from the power supply 302 drops more and more, the loop in FIG. 5 occurs more rapidly as the power supply 302 is depleted. Thus, the blinking of the one or more LEDs 304 (or other deactivation and activation of at least part of the device) speeds up as the power stored in the power supply 302 drops.

Although FIG. 5 illustrates one example of a method 500 for providing a low power indicator for optical scopes and other devices, various changes may be made to FIG. 5. For example, while shown as a series of steps, various steps in FIG. 5 could overlap, occur in parallel, occur in a different order, or occur any number of times. As a particular example, steps 502-506 could generally overlap with one another, steps 512-514 506 could generally overlap with one another, and steps 518-520 506 could generally overlap with one another.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
one or more light emitting diodes configured to be coupled to a power supply and to generate illumination that forms a reticle;

a first switch coupled in series with the one or more light emitting diodes, the first switch configured to selectively activate and deactivate the one or more light emitting diodes based on whether the first switch is turned on or off;
a voltage divider configured to be coupled to the power supply, the voltage divider comprising first and second resistors coupled in series;
a low power detector coupled to the voltage divider and configured to sense a low power condition of the power supply, the low power detector also configured to generate a control signal that repeatedly turns the first switch on and off in response to the low power condition in order to cause the one or more light emitting diodes to blink and thereby cause the reticle to blink; and
a second switch coupled in series with the voltage divider, the second switch configured to be controlled based on the control signal;
wherein the low power detector is configured to turn the first switch on and off at a given rate and the given rate increases as the power supply is depleted.

2. The apparatus of claim 1, wherein the low power detector is configured to consume less power during operation than the one or more light emitting diodes.

3. The apparatus of claim 1, wherein:
an output of the low power detector is coupled to (i) a gate of the first switch and (ii) a third resistor coupled to a gate of the second switch; and
a capacitor is coupled to the third resistor and to the gate of the second switch.

4. The apparatus of claim 3, further comprising:
a fourth resistor configured to be coupled to the power supply and coupled to the output of the low power detector;
wherein the fourth resistor is configured to pull the gates of the first and second switches high when the low power detector is not detecting the low power condition of the power supply.

5. An apparatus comprising:
one or more light emitting diodes configured to be coupled to a power supply and to generate illumination;
a first switch coupled in series with the one or more light emitting diodes, the first switch configured to selectively activate and deactivate the one or more light emitting diodes based on whether the first switch is turned on or off;
a voltage divider configured to be coupled to the power supply, the voltage divider comprising first and second resistors coupled in series;
a first capacitor coupled between the first and second resistors, the first capacitor configured to be charged or discharged based on a voltage generated between the first and second resistors;
a low power detector configured to sense a low power condition of the power supply, the low power detector also configured to repeatedly turn the first switch on and off in response to the low power condition to cause the one or more light emitting diodes to blink, wherein the low power detector is configured to turn the first switch on and off at a given rate and the given rate increases as the power supply is depleted; and
a second switch configured to be coupled between the voltage divider and ground, wherein the second switch when turned on is configured to allow current to flow through the first and second resistors and through the second switch, wherein the second switch when turned off is configured to allow current to flow through the first resistor and the first capacitor but not through the second resistor;
wherein an output of the low power detector is coupled to (i) a gate of the first switch and (ii) a third resistor coupled to a gate of the second switch; and
wherein a second capacitor is coupled to the third resistor and to the gate of the second switch.

6. The apparatus of claim 5, wherein the low power detector is configured to consume less power during operation than the one or more light emitting diodes.

7. The apparatus of claim 5, wherein the one or more light emitting diodes are configured to generate a reticle in an optical scope.

8. A system comprising:
an optical scope comprising an eyepiece;
one or more light emitting diodes configured to be coupled to a power supply and to generate illumination that forms a reticle viewable through the eyepiece of the optical scope; and
a low power indicator circuit comprising:
a first switch coupled in series with the one or more light emitting diodes, the first switch configured to selectively activate and deactivate the one or more light emitting diodes based on whether the first switch is turned on or off;
a voltage divider configured to be coupled to the power supply, the voltage divider comprising first and second resistors coupled in series;
a low power detector coupled to the voltage divider and configured to sense a low power condition of the power supply, the low power detector also configured to generate a control signal that repeatedly turns the first switch on and off in response to the low power condition to cause the one or more light emitting diodes and the reticle to blink; and
a second switch coupled in series with the voltage divider, the second switch configured to be controlled based on the control signal;
wherein the low power detector is configured to turn the first switch on and off at a given rate and the given rate increases as the power supply is depleted.

9. The system of claim 8, wherein the low power detector is configured to consume less power during operation than the one or more light emitting diodes.

10. The system of claim 8, wherein the low power indicator circuit further comprises:
a first capacitor coupled between the first and second resistors, the first capacitor configured to be charged or discharged based on a voltage generated between the first and second resistors.

11. The system of claim 10, wherein:
an output of the low power detector is coupled to (i) a gate of the first switch and (ii) a third resistor coupled to a gate of the second switch; and
a second capacitor is coupled to the third resistor and to the gate of the second switch.

12. The system of claim 11, wherein:
the low power indicator circuit further comprises a fourth resistor configured to be coupled to the power supply and coupled to the output of the low power detector; and
the fourth resistor is configured to pull the gates of the first and second switches high when the low power detector is not detecting the low power condition of the power supply.

13. The system of claim 8, wherein the second switch is configured to be coupled between the voltage divider and ground.

14. The system of claim 8, wherein the optical scope is configured to be coupled to a rifle.

15. A method comprising:
generating illumination using one or more light emitting diodes coupled to a power supply, wherein generating the illumination comprises generating a reticle in an optical scope;
detecting a low power condition of the power supply; and
in response to detecting the low power condition, repeatedly activating and deactivating the one or more light emitting diodes using a first switch coupled in series with the one or more light emitting diodes to cause the one or more light emitting diodes and the reticle to blink, wherein the repeated activating and deactivating is based on turning the first switch on and off;
wherein the first switch is turned on and off at a given rate and the given rate increases as the power supply is depleted;
wherein the first switch is turned on and off based on a control signal generated using a voltage from a voltage divider coupled to the power supply, the voltage divider comprising first and second resistors coupled in series; and
wherein a second switch coupled in series with the voltage divider is controlled based on the control signal.

16. The method of claim 15, wherein the second switch is coupled between the voltage divider and ground.

17. The method of claim 15, wherein:
detecting the low power condition comprises using a low power detector;
an output of the low power detector is coupled to (i) a gate of the first switch and (ii) a third resistor coupled to a gate of the second switch; and
a capacitor is coupled to the third resistor and to the gate of the second switch.

18. The method of claim 17, wherein:
a fourth resistor is coupled to the power supply and to the output of the low power detector; and
the fourth resistor pulls the gates of the first and second switches high when the low power detector is not detecting the low power condition of the power supply.

19. A method comprising:
generating illumination using one or more light emitting diodes coupled to a power supply;
charging and discharging a first capacitor coupled between first and second resistors of a voltage divider coupled to the power supply, the first capacitor charged or discharged based on a voltage generated between the first and second resistors;
detecting a low power condition of the power supply;
in response to detecting the low power condition, repeatedly activating and deactivating the one or more light emitting diodes using a first switch coupled in series with the one or more light emitting diodes to cause the one or more light emitting diodes to blink, wherein the repeated activating and deactivating is based on turning the first switch on and off, wherein the first switch is turned on and off at a given rate and the given rate increases as the power supply is depleted; and
controlling a second switch coupled between the voltage divider and ground, wherein the second switch when turned on allows current to flow through the first and second resistors and through the second switch, wherein the second switch when turned off allows current to flow through the first resistor and the first capacitor but not through the second resistor;
wherein detecting the low power condition comprises using a low power detector;
wherein an output of the low power detector is coupled to (i) a gate of the first switch and (ii) a third resistor coupled to a gate of the second switch; and
wherein a second capacitor is coupled to the third resistor and to the gate of the second switch.

20. The method of claim 19, wherein:
generating the illumination comprises generating a reticle in an optical scope; and
repeatedly turning the first switch on and off causes the reticle to blink.

* * * * *